US009139004B2

(12) United States Patent
Redding et al.

(10) Patent No.: US 9,139,004 B2
(45) Date of Patent: Sep. 22, 2015

(54) PRINT HEAD TRANSDUCER DICING DIRECTLY ON DIAPHRAGM

(75) Inventors: Gary D. Redding, Victor, NY (US); Antonio L. Williams, Rochester, NY (US); John P. Meyers, Rochester, NY (US)

(73) Assignee: XEROX CORPORATION, Norwalk, CT (US)

( * ) Notice: Subject to any disclaimer, the term of this patent is extended or adjusted under 35 U.S.C. 154(b) by 578 days.

(21) Appl. No.: 13/412,516

(22) Filed: Mar. 5, 2012

(65) Prior Publication Data

US 2013/0227826 A1 Sep. 5, 2013

(51) Int. Cl.

*H01L 41/22* (2013.01)
*B21D 39/03* (2006.01)
*B23Q 17/00* (2006.01)
*H05K 3/30* (2006.01)
*H01L 21/00* (2006.01)
*H01L 21/46* (2006.01)
*B41J 2/16* (2006.01)

(52) U.S. Cl.

CPC ................ *B41J 2/161* (2013.01); *B41J 2/1623* (2013.01); *B41J 2/1626* (2013.01); *B41J 2/1632* (2013.01); *Y10T 29/42* (2015.01); *Y10T 29/4913* (2015.01); *Y10T 29/49764* (2015.01); *Y10T 29/49778* (2015.01); *Y10T 29/49826* (2015.01)

(58) Field of Classification Search

CPC ..................... H01L 41/39; H01L 2924/01079; H01L 21/78; H01L 21/76254; Y02E 30/40; B23P 19/04; B62D 65/06

USPC .............. 29/25.35, 428, 407.01, 407.09, 832; 438/462, 464, 458

See application file for complete search history.

(56) References Cited

U.S. PATENT DOCUMENTS

| | | | | |
|---|---|---|---|---|
| 3,723,223 | A * | 3/1973 | Le Compte | 156/313 |
| 4,730,197 | A * | 3/1988 | Raman et al. | 347/40 |
| 4,897,903 | A * | 2/1990 | Johannsen | 29/25.35 |
| 5,714,078 | A * | 2/1998 | Thiel | 216/27 |
| 6,109,737 | A * | 8/2000 | Kishima | 347/70 |
| 7,862,678 | B2 * | 1/2011 | Andrews et al. | 156/250 |
| 8,118,742 | B2 * | 2/2012 | Dickinson et al. | 600/437 |
| 8,602,523 | B2 * | 12/2013 | Grabowski et al. | 347/37 |
| 8,608,293 | B2 * | 12/2013 | Redding et al. | 347/68 |
| 2004/0117960 | A1 * | 6/2004 | Kelley et al. | 29/25.35 |
| 2005/0045272 | A1 * | 3/2005 | McGlothlan | 156/267 |
| 2006/0052707 | A1 * | 3/2006 | Dickinson et al. | 600/466 |
| 2012/0232400 | A1 * | 9/2012 | Dickinson et al. | 600/463 |
| 2013/0227826 | A1 * | 9/2013 | Redding et al. | 29/25.35 |

* cited by examiner

*Primary Examiner* — David Angwin
(74) *Attorney, Agent, or Firm* — Marger Johnson

(57) ABSTRACT

A method of mounting print head transducers to a diaphragm includes providing a print head transducer slab with a diaphragm, heating the transducer slab and the diaphragm to a cure temperature, pressing the diaphragm to the slab to form an assembly at the cure temperature, and dicing the slab to separate the slab into an array of print head transducers after pressing the diaphragm to the slab, wherein the array of print head transducers align with an array of body cavities, thereby mounting the array of print head transducers to the diaphragm.

9 Claims, 6 Drawing Sheets

PRINT HEAD TRANSDUCER DICING DIRECTLY ON DIAPHRAGM

Many types of ink jet printers use transducers to selectively push ink out of individual apertures, also referred to as nozzles or jets, in an array of apertures. The resulting pattern of ink formed on a print substrate makes a print image. The transducers generally reside adjacent to a pressure chamber. A set of signals generally cause the transducer to act against a membrane.

One signal causes the transducer to move the membrane in a direction away from the aperture, filling the pressure chamber with ink. A second signal, typically of opposite polarity of the first, causes the membrane to move the other direction, pushing ink out of the pressure chamber through the aperture.

Generally, one transducer exists for each aperture and pressure chamber, and the array of transducers aligns to the arrays of pressure chambers. The desire for high resolution print images has driven the density of the array of apertures increasingly higher. The array of transducers has to match the higher density. The number of apertures corresponds to the number of body cavities, which in turn correspond to the number of transducers. The high density leads to extremely tight tolerances during manufacture of a print head.

In current products, the body cavities and the apertures are already aligned and bonded. The alignment between the body cavities and the diced transducers with the membrane in between give rise to the issues. This process usually involves the offline dicing of a slab of transducers, such as piezoelectric transducers (PZT), and a post-dicing transducer transfer alignment process. This conventional approach has three major contributors to the transducer alignment variability.

First, the dicing operation provides a first source of misalignment. If the dicing pattern is misaligned, it will become very difficult to get the diced transducers aligned to the body cavities. Second, the merge operation in which the diced transducer substrate is merged with the diaphragm requires extremely tight tolerances to ensure that the diced transducers align correctly to the cavities. Third, the press operation bonds the diaphragm to the membrane by applying pressure and heat that may cause a shifting between the two. Of these three, the dicing operation has the highest precision.

DETAILED DESCRIPTION OF THE EMBODIMENTS

Figure 1:
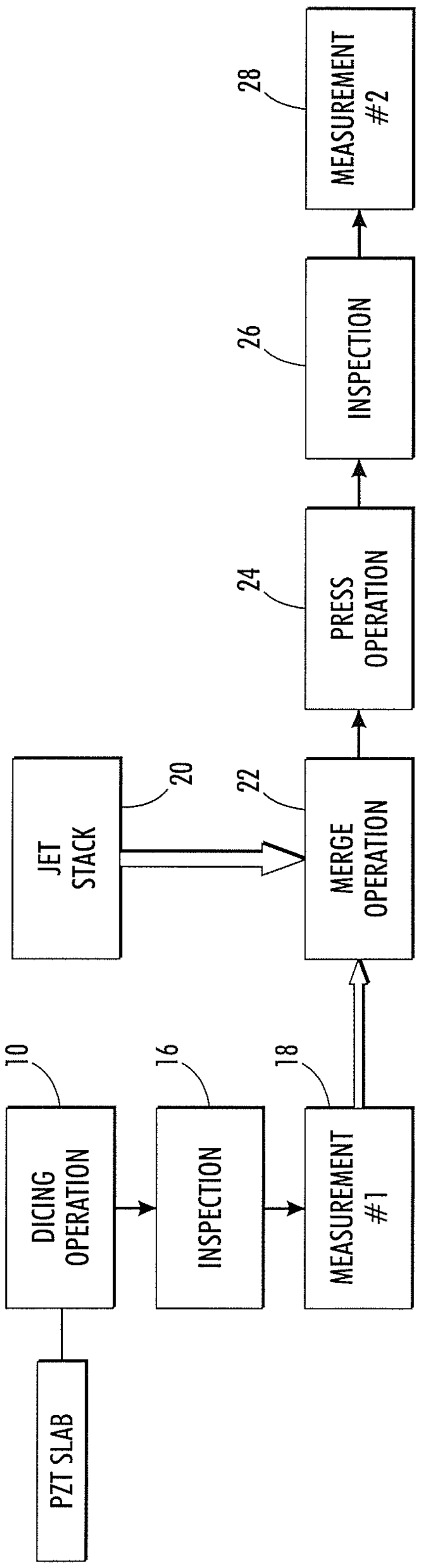
FIG. 1 shows a flow chart of an example of a diaphragm and transducer alignment and bonding process.

FIG. 1 shows an example of a current method of mounting transducers to a jet stack. A jet stack typically consists of a stack of plates or membranes that form fluid channels through which ink flows from an ink reservoir to an array of nozzles or apertures. Ink selectively exits the apertures to form a printed image on a print substrate. The jet stack may have multiple plates to form the channels. Typically, one of the plates forms a body cavity or pressure chamber and is called the body plate. The diaphragm upon which the transducers operate to cause to flow into and out of the body cavity via one of the nozzles typically mounts to the body plate. The transducers in turn mount to the diaphragm.

In FIG. 1, the transducer slab consists of a piezoelectric material sandwiched between two electrically conductive layers. This discussion here may refer to the slab as the PZT slab, with the understanding that the slab may contain any array of transducers that separate upon dicing of the slab.

The dicing of the slab at 10 marks the first possible misalignment between the transducers and the jet stack. After dicing, the slab has become an array of individual transducers and undergoes inspection at 16. A measurement generally occurs after inspection at 18 to ensure the alignment of the dicing lines is correct.

During the course of these operations on the slab, an adhesive is applied to the jet stack at 20. The two then undergo alignment and merging at 22. This provides another possible source of misalignment between the transducers and the body cavities in the jet stack. The transducers on their slab are then pressed against the jet stack at 24, the pressure of which may cause the slab to slip or slide causing further misalignment. The assembly then undergoes a second inspection at 26 and a second measurement at 28. As will be discussed further, the second measurement that cause further delay and raise costs may be eliminated.

Figure 2:
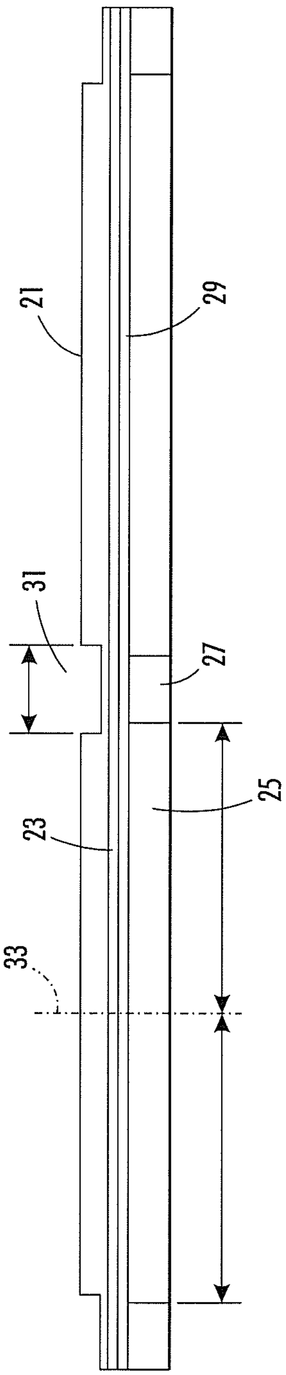
FIG. 2 shows a body plate having a body cavity aligned with a transducer.

FIG. 2 shows a side view of a diced transducer slab 21 on a diaphragm 23. The diaphragm bonds to a jet stack, in this instance the body plate 27, by an adhesive 29. The issue with alignment occurs because the transducers must align with the body cavities or the jet stack may fail to operate properly. As shown in the diagram, the transducer centerline 33 aligns with the center of the body cavity 25. The individual transducers are defined by the dicing kerfs such as 31.

Figure 3:
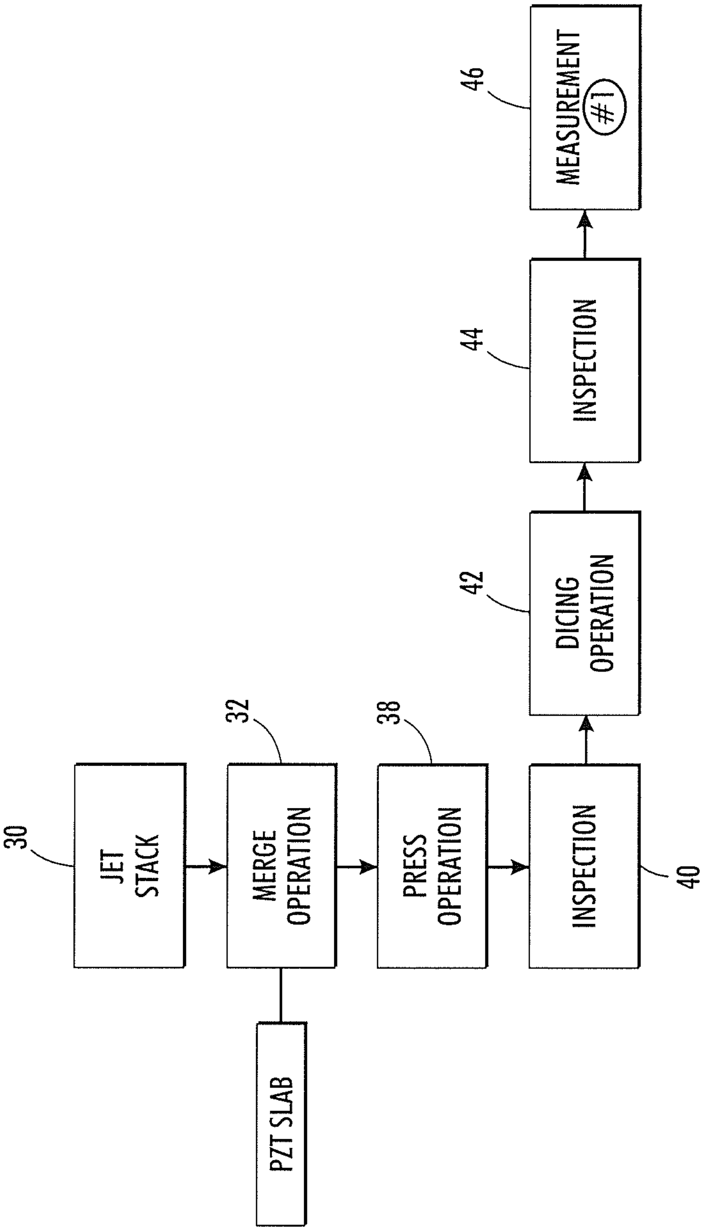
FIG. 3 shows a flow chart of an embodiment of an improved diaphragm and transducer alignment and bonding process.

FIG. 3 shows an embodiment of a process that allows the slab to undergo dicing after attachment to the jet stack or a portion of it. Similar to the process of FIG. 1, the process of FIG. 3 begins with the jet stack 30, and then the transducer slab merged to the jet stack at 32, typically involving application of an adhesive. The surface tension of the adhesive would hold the slab in place until the press operation at 38. The undiced slab is then pressed to the jet stack at 38, or at least the portion of the jet stack that includes the membrane. This may actually consist of just the membrane, the membrane attached to a fixture of some sort, the membrane attached to the body plate, etc.

In the embodiments discussed here, the slab may have a larger size than the final diced state, so the alignment of the slab to the diaphragm does not have to have high accuracy. After the merge and press operation, the assembly then undergoes inspection at 40.

The dicing operation then commences at 42. The dicing operation may result in a slight alteration of having openings in the diaphragm so the dicing equipment vision tools can align on the body cavities more accurately. This represents the sole source of misalignment possibilities in this embodiment of the process. A single inspection occurs at 44, with a single measurement at 46.

In experiments, a comparison of the alignment between the current approach such as in FIG. 1 and the approach as in FIG. 3 was made. A key measurement is the average delta between the nominal transducer centerpoint and the actual measured transducer centerpoint in both X (horizontal) and Y (vertical). The standard deviation of the X and Y measurements for the approach in FIG. 3 was between 2 and 6 times lower than the current process in FIG. 1. The lower the standard deviation the better.

Figure 4:
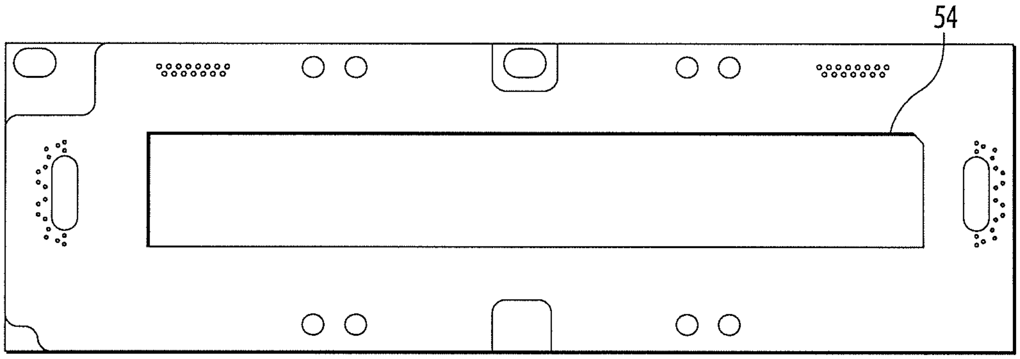
FIG. 4 shows an example of a transducer slab after bonding.

FIG. 4 shows a slab after the press operation. In initial experiments, the slab suffered from cracking. With many material configurations, the coefficient of expansion differs between the slab material and the diaphragm to which it attaches. If pressure occurs prior to the two materials expanding separately, cracks result. Adjustments now ensure that the press operation did not occur until both of the materials had reached the cure temperature and the slab experienced no cracking. One should note that no issues with dicing the slab existed in any of the experiments.

Figure 5:
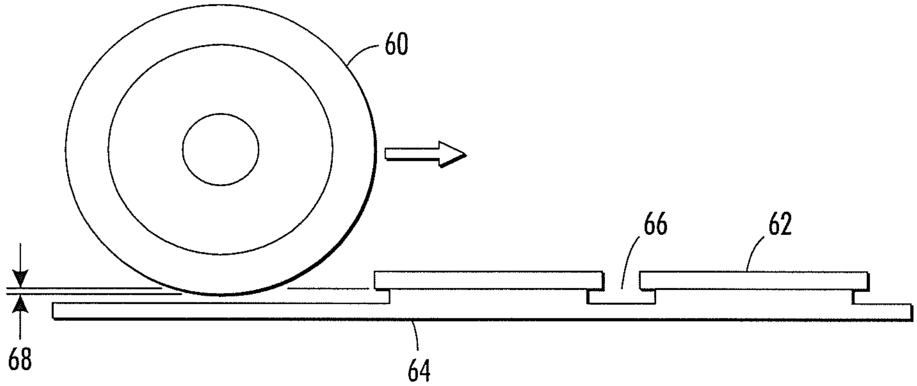
FIGS. 5-7 show alternative embodiments of dicing operation parameters.
Figure 6:
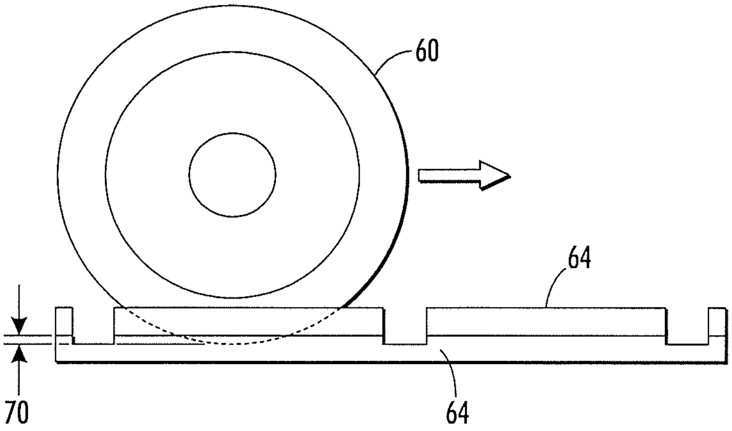
Figure 7:
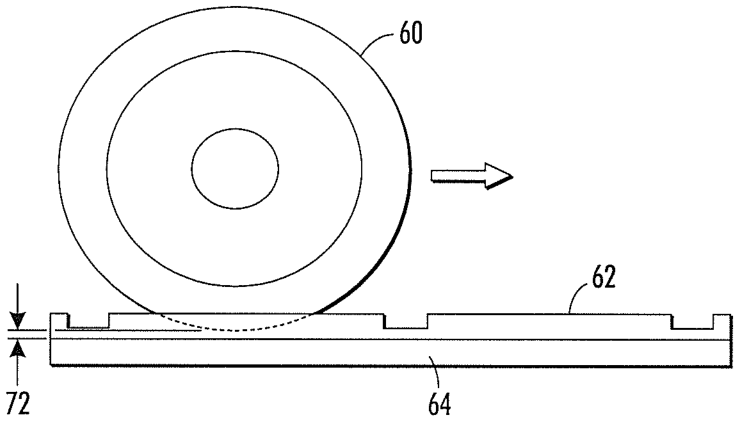

The dicing operation has several variations. FIGS. 5-7 demonstrate some of these. For example, in FIG. 5 the diaphragm 64 has undergone a half etch forming cavities along what will eventually make the saw lines. The dicing blade 60 has a depth 68 set to cut all the way through the slab 62, but not past the cavities such as 66. The half etch could extend well beyond the end of the array to avoid score marks that may interfere with future layers and ink paths.

In FIG. 6, the diaphragm remains unetched. The diaphragm has a size that results in minimal material beyond the edge of the transducer array. Attaching a slab-sized diaphragm attached to a larger thin plate may allow this, as will attaching a slab-sized diaphragm directly to the body plate. The dicing blade 60 has a depth 70 adjusted to just lightly score the top of the diaphragm 64. If the process does not use a two-layered diaphragm or a slab-sized diaphragm, the design must account for score marks and avoid ink channels in these areas. The process may include filling or otherwise planarizing the score marks external to the array with a polymer or adhesive to avoid issues with ink paths.

FIG. 7 shows another variation. In this embodiment, the transducer array becomes singulated or separated once the top layer of the slab is cut. For example, the slab may consist of a slab of lead zirconate titanate (PZT) having the entire top and bottom of the slab nickel plate for the electrical planes. Once the blade penetrates the top layer, the individual tiles become electrically isolated. One may need to perform some evaluation to determine the extent of cross talk that would occur between the tiles. In FIG. 7, the blade has a depth 72 such that the blade penetrates the top layer of the slab 62, but does not penetrate all the way through the bottom layer.

In this manner, the alignment process of the transducer array to the array of body cavities becomes simpler with higher accuracy. By dicing the slab on the jet stack or a portion of it, two of the sources of misalignment are eliminated. As shown in the table above, the current standard deviation of final alignment is 3 times the standard deviation of the embodiments disclosed here.

Figure 8:
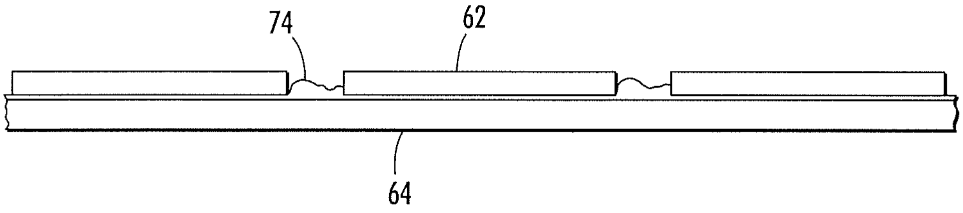
FIG. 8 shows an example of adhesive squeeze out.

Further, potential cross talk from the attach adhesive is eliminated. As shown in FIG. 8, when the slab attaches to the diaphragm 64 after dicing, as in FIG. 1, adhesive 74 may squeeze out into the spaces between the tiles such as 62. This creates a source of cross talk between the transducer tiles. When the slab attaches before dicing, the adhesive is cured before dicing, thus can not propagate into the dicing kerf. This may also allow the use of conductive contact adhesive between the transducer slab and diaphragm if desired to strengthen the electrical connection.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A method of mounting print head transducers to a diaphragm, comprising:

adhering a diaphragm on a print head transducer slab with an adhesive;

heating the transducer slab and the diaphragm to a cure temperature of the adhesive;

pressing the diaphragm to the slab to form an assembly at the cure temperature; and dicing the slab to separate the slab into an array of print head transducers after pressing the diaphragm to the slab, wherein the array of print head transducers align with an array of body cavities, thereby mounting the array of print head transducers to the diaphragm.

2. The method of claim 1, further comprising inspecting the assembly after dicing.

3. The method of claim 2, further comprising measuring alignment of the assembly after inspecting.

4. The method of claim 1, wherein pressing comprises curing the slab and the diaphragm after merging before dicing.

5. The method of claim 1, wherein the diaphragm has half-etched lines forming cavities and dicing the slab comprises setting a dicing blade cut depth to a depth corresponding to a depth within the cavities.

6. The method of claim 1, wherein dicing the slab comprises setting a dicing blade cut depth to score the top of the diaphragm after cutting through the slab.

7. The method of claim 6, wherein the diaphragm has minimal material beyond edges of the slab.

8. The method of claim 6, further comprising filling in any score marks in the diaphragm external to the slab.

9. The method of claim 1, wherein the slab has a top electrically conductive layer and dicing the slab comprises setting a dicing blade cutting depth to cut the electrically conductive layer of the slab but not through the bottom surface of the slab.

* * * * *